(12) United States Patent
Wu

(10) Patent No.: US 9,679,872 B1
(45) Date of Patent: Jun. 13, 2017

(54) CONNECTION STRUCTURE FOR SEMICONDUCTOR PACKAGE HAVING PLURAL VIAS LOCATED WITHIN PROJECTION OF CONDUCTIVE UNIT

(71) Applicant: Chengwei Wu, New Taipei (TW)

(72) Inventor: Chengwei Wu, New Taipei (TW)

( * ) Notice: Subject to any disclaimer, the term of this patent is extended or adjusted under 35 U.S.C. 154(b) by 0 days.

(21) Appl. No.: 15/253,011

(22) Filed: Aug. 31, 2016

Related U.S. Application Data

(60) Provisional application No. 62/380,997, filed on Aug. 29, 2016.

(51) Int. Cl.
*H01L 23/498* (2006.01)
*H01L 25/065* (2006.01)
*H01L 23/00* (2006.01)
*H05K 1/18* (2006.01)

(52) U.S. Cl.
CPC .... *H01L 25/0655* (2013.01); *H01L 23/49816* (2013.01); *H01L 23/49822* (2013.01); *H01L 23/49827* (2013.01); *H01L 23/49838* (2013.01); *H01L 24/05* (2013.01); *H01L 24/08* (2013.01); *H01L 24/13* (2013.01); *H01L 24/17* (2013.01); *H05K 1/181* (2013.01); *H01L 2224/05009* (2013.01); *H01L 2224/13009* (2013.01); *H01L 2924/1436* (2013.01); *H01L 2924/1451* (2013.01); *H05K 2201/10159* (2013.01)

(58) Field of Classification Search
CPC ......... H01L 23/49816; H01L 23/49822; H01L 23/49838; H01L 23/49844; H01L 24/05; H01L 24/08; H01L 24/13; H01L 24/16; H01L 25/0657; H01L 2224/05008; H01L 2224/05009; H01L 2224/0801; H01L 2224/13008; H01L 2224/13009; H01L 2224/1601; H05K 2201/10159
See application file for complete search history.

(56) References Cited

U.S. PATENT DOCUMENTS

| | | | |
|---|---|---|---|
| 2010/0032835 A1* | 2/2010 | Daubenspeck | H01L 24/13 257/738 |
| 2011/0147922 A1* | 6/2011 | Bezama | H01L 21/76804 257/737 |
| 2012/0061827 A1* | 3/2012 | Fujita | H01L 21/30655 257/737 |
| 2012/0220079 A1* | 8/2012 | Fujii | H01L 23/3128 438/107 |
| 2015/0123266 A1* | 5/2015 | Wu | H01L 23/49816 257/737 |

* cited by examiner

*Primary Examiner* — Stephen W Smoot
(74) *Attorney, Agent, or Firm* — WPAT, PC; Justin King

(57) ABSTRACT

A connection structure is provided. The connection structure comprises a conductive unit, a solder bump, a first insulating layer, a second insulating layer, a third insulating layer, and a plurality of vias. The solder bump is in direct contact with the conductive unit. The first insulating layer is located under a flange of the conductive unit. The second insulating layer is located under a base of the conductive unit. The third insulating layer is located under the second insulating layer. The third insulating layer has a via zone. A plurality of vias are located in the via zone. The via zone is within a vertical projection of the conductive unit.

18 Claims, 18 Drawing Sheets

CONNECTION STRUCTURE FOR SEMICONDUCTOR PACKAGE HAVING PLURAL VIAS LOCATED WITHIN PROJECTION OF CONDUCTIVE UNIT

FIELD OF THE INVENTION

The invention relates to semiconductor packages. More particularly, it relates to wafer level chip scale packages (WLCSP).

BACKGROUND OF THE INVENTION

In the semiconductor industry, the integration density within a die is growing rapidly. A die can include a huge amount of active and passive electronic devices so that a lot of functions can be performed within the die. The electronic devices are formed by semiconductor manufacturing processes on a silicon wafer. After the manufacturing processes of the electronic devices are finished, the wafer can be separated into many dies. Each die may then go through packaging processes so that a protection package is formed outside the die. The package for a die can also be an interface for connections between the die and a printed circuit board. Typical applications for integrated circuits include mobile phone systems, television systems, personal computer systems, and networking systems.

Many types of package have been developed, such as dual in-line pin package (DIP), quad flat package (QFP), ball grid array (BGA), and wafer level chip scale package (WLCSP). A DIP has connection pins on two parallel sides. DIPs usually use through-hole-mounting or sockets to be placed on printed circuit boards. DIPs usually comprise insulating materials filled around a metal lead frame.

A QFP usually has wing-like leads extending from four sides of the package. A QFP has connections only from the peripheral area of the package, so its pin count is limited. A BGA can use a whole surface to form an array of connections so that it can provide higher ball count. The length between the array of connections and the die is shorter, which is better for high speed signal transmission. A WLCSP can have a packaged device which is nearly the same size of a die. A WLCSP is generally smaller than a BGA package.

SUMMARY OF THE INVENTION

One objective of the invention is to provide a connection structure that can help to reduce stress in a semiconductor package.

Another objective of the invention is to provide arrangements of vias below a conductive unit of a redistribution structure so that a better conductivity is achieved.

Still another objective of the invention is to provide a connection structure that is symmetric with respect to a central point so that a balance of stress is achieved.

According to one aspect of the invention, a connection structure is provided. The connection structure comprises a conductive unit, a solder bump, a first insulating layer, a second insulating layer, a third insulating layer, and a plurality of vias. The conductive unit has a rim. The conductive unit comprises a flange, a slanting side wall, and a base. The solder bump is located on the conductive unit. The solder bump is in direct contact with the conductive unit. The first insulating layer is located under the flange. The second insulating layer is located under the base of the conductive unit. The third insulating layer is located under the second insulating layer. The third insulating layer has a via zone. A plurality of vias are located in the via zone. The via zone is within a vertical projection of the conductive unit.

According to another aspect of the invention, a connection structure is disclosed. The connection structure comprises a conductive unit, a solder bump, a first insulating layer, a second insulating layer, a third insulating layer, a first via, and a second via. The conductive unit has a rim. The conductive unit comprises a flange, a slanting side wall, and a base. The solder bump is located on the conductive unit. The solder bump is in direct contact with the conductive unit. The first insulating layer is located under the flange. The second insulating layer is located under the base of the conductive unit. The third insulating layer is located under the second insulating layer. The first via is in the third insulating layer.

The first via has a first via rim. The first via rim has a first via rim diameter. The first via has a first via bottom edge. The first via is within a vertical projection of the conductive unit. The second via is in the third insulating layer. The second via has a second via rim. The second via rim has a second rim diameter. The second via has a second via bottom edge. The second via is within the vertical projection of the conductive unit. A bottom edge distance is a distance between the first via bottom edge and the second via bottom edge and the first rim diameter is greater than the bottom edge distance.

According to still another aspect of the invention, a connection structure is disclosed. The connection structure comprises a conductive unit, a solder bump, a first insulating layer, a second insulating layer, a third insulating layer, a first via, a second via, a third via, and a fourth via. The conductive unit has a rim. The conductive unit comprises a flange, a slanting side wall, and a base. The solder bump is located on the conductive unit. The solder bump is in direct contact with the conductive unit. The first insulating layer is located under the flange. The second insulating layer is located under the base of the conductive unit. The third insulating layer is located under the second insulating layer.

The first via is located in the third insulating layer. More than half of the first via being within a vertical projection of the rim of the conductive unit. The second via is located in the third insulating layer. More than half of the second via being within the vertical projection of the rim of the conductive unit. The third via is located in the second insulating layer. More than half of the third via being within a vertical projection of the flange and the slanting side wall of the conductive unit. The fourth via is located in the second insulating layer. More than half of the fourth via is within the vertical projection of the flange and the slanting side wall of the conductive unit.

DETAILED DESCRIPTION OF THE INVENTION

Figure 1:
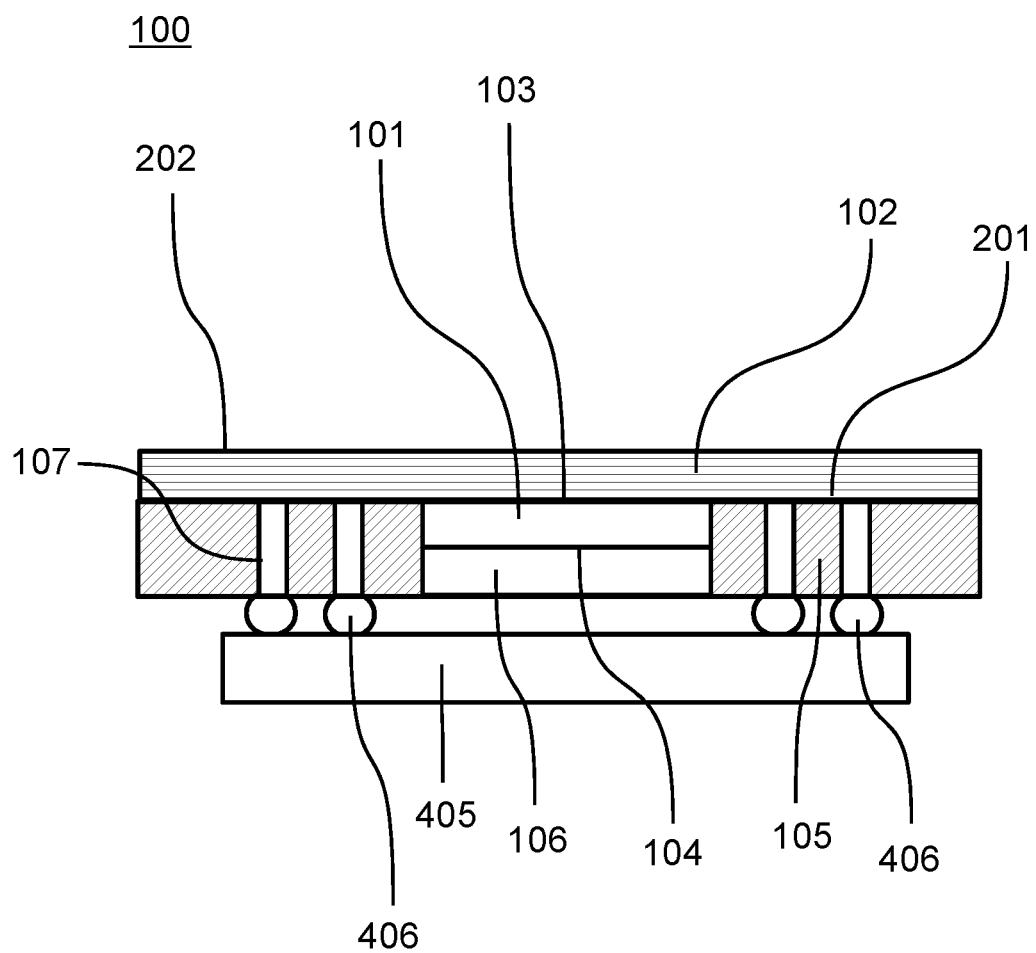
FIG. 1 shows an embodiment of a semiconductor device.
Figure 2:
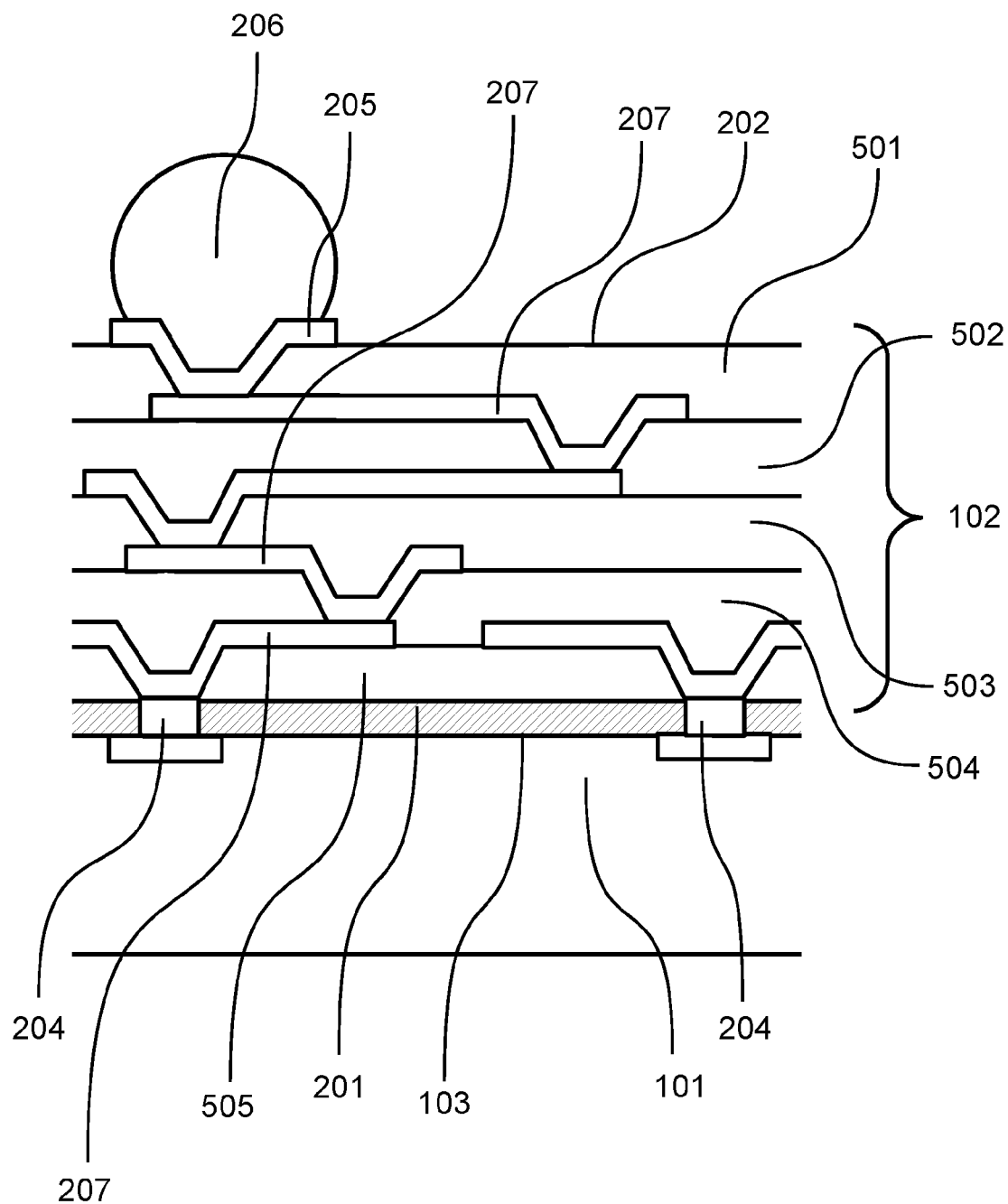
FIG. 2 shows a cross-sectional view of a redistribution structure.
Figure 3:
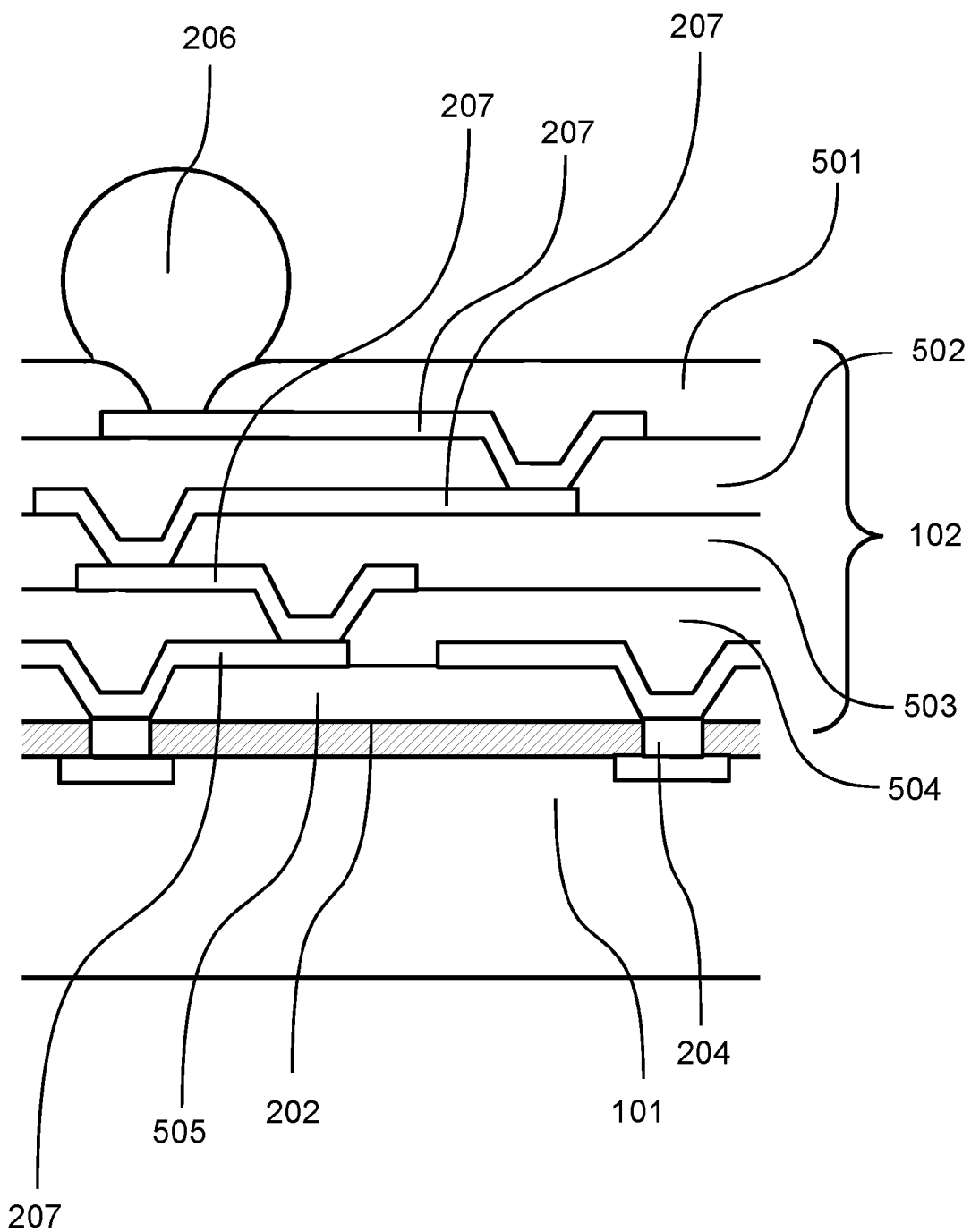
FIG. 3 shows a cross-sectional view of another redistribution structure.
Figure 4:
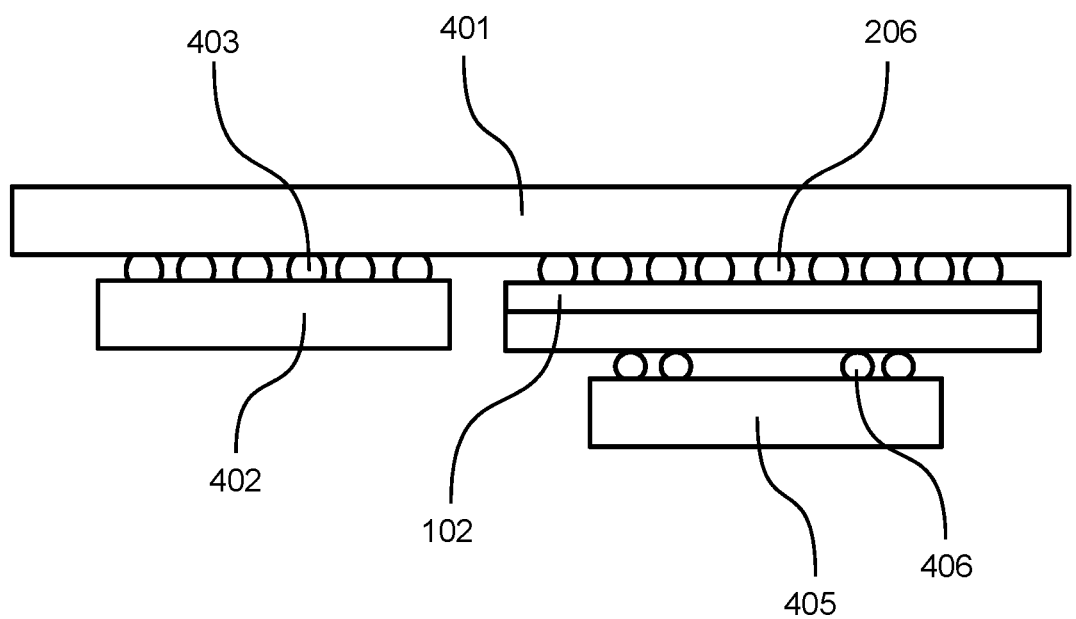
FIG. 4 shows an embodiment of a semiconductor device.
Figure 5:
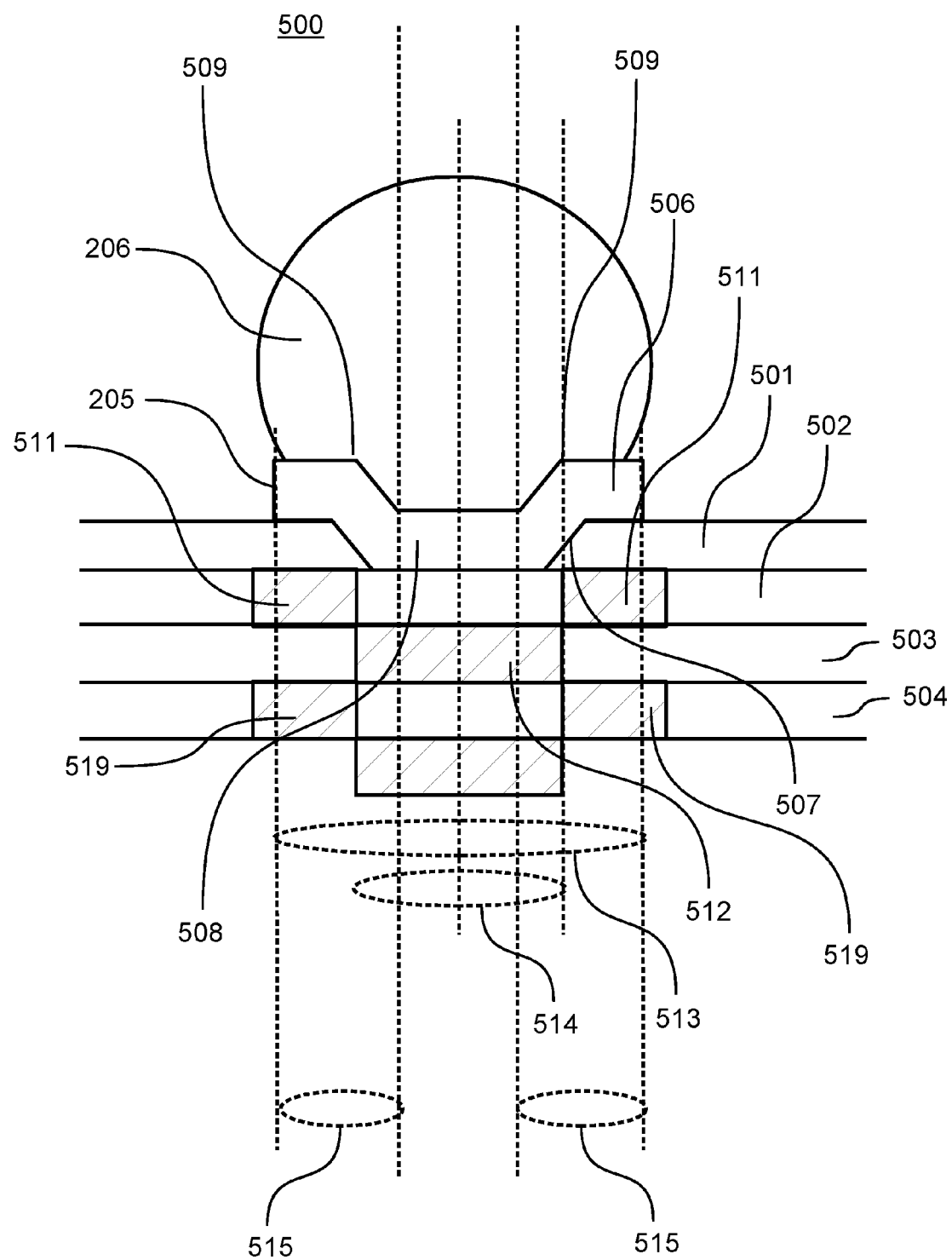
FIG. 5 shows a cross-sectional view of a connection structure.
Figure 6:
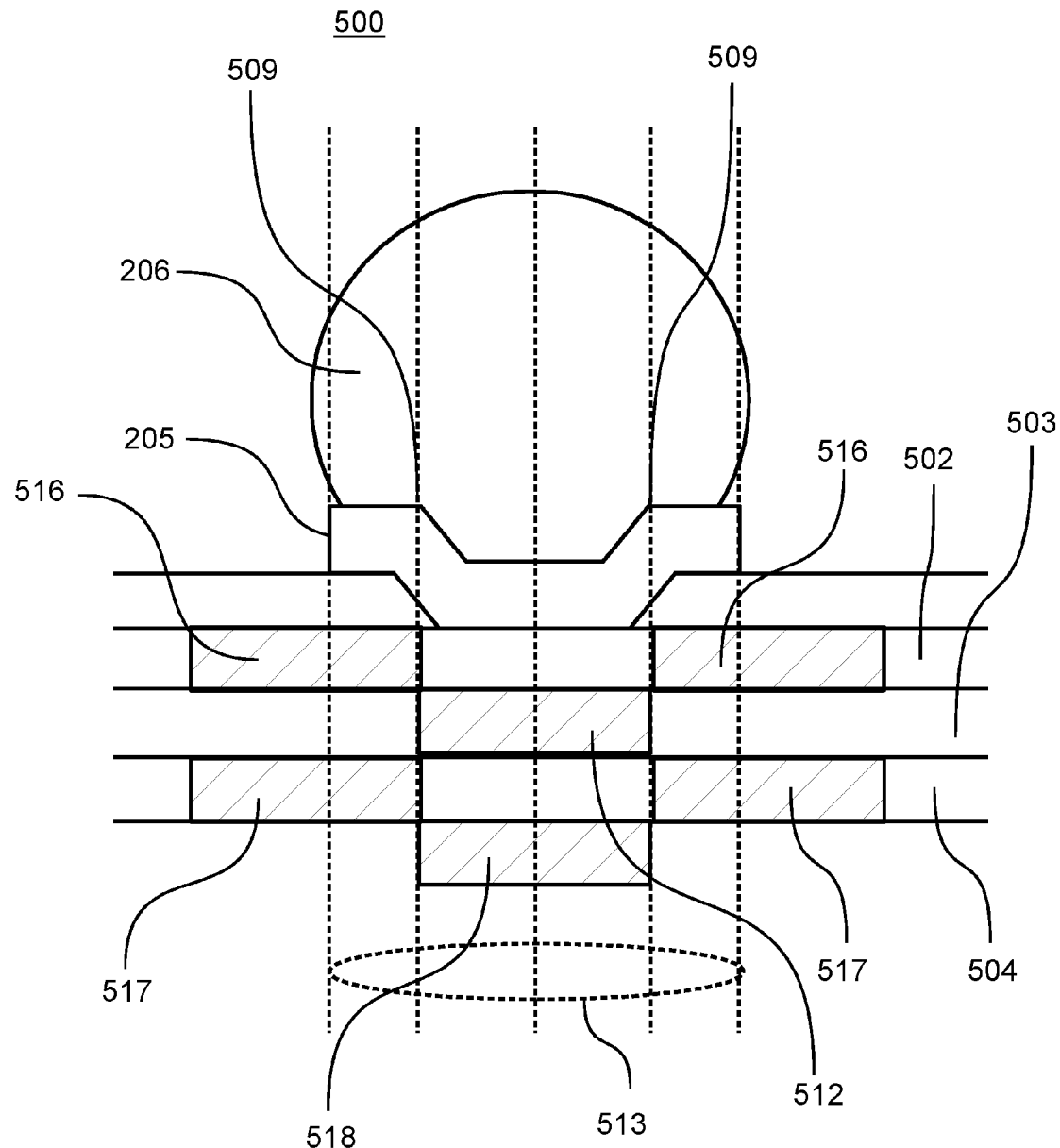
FIG. 6 shows a cross-sectional view of another connection structure.
Figure 7:
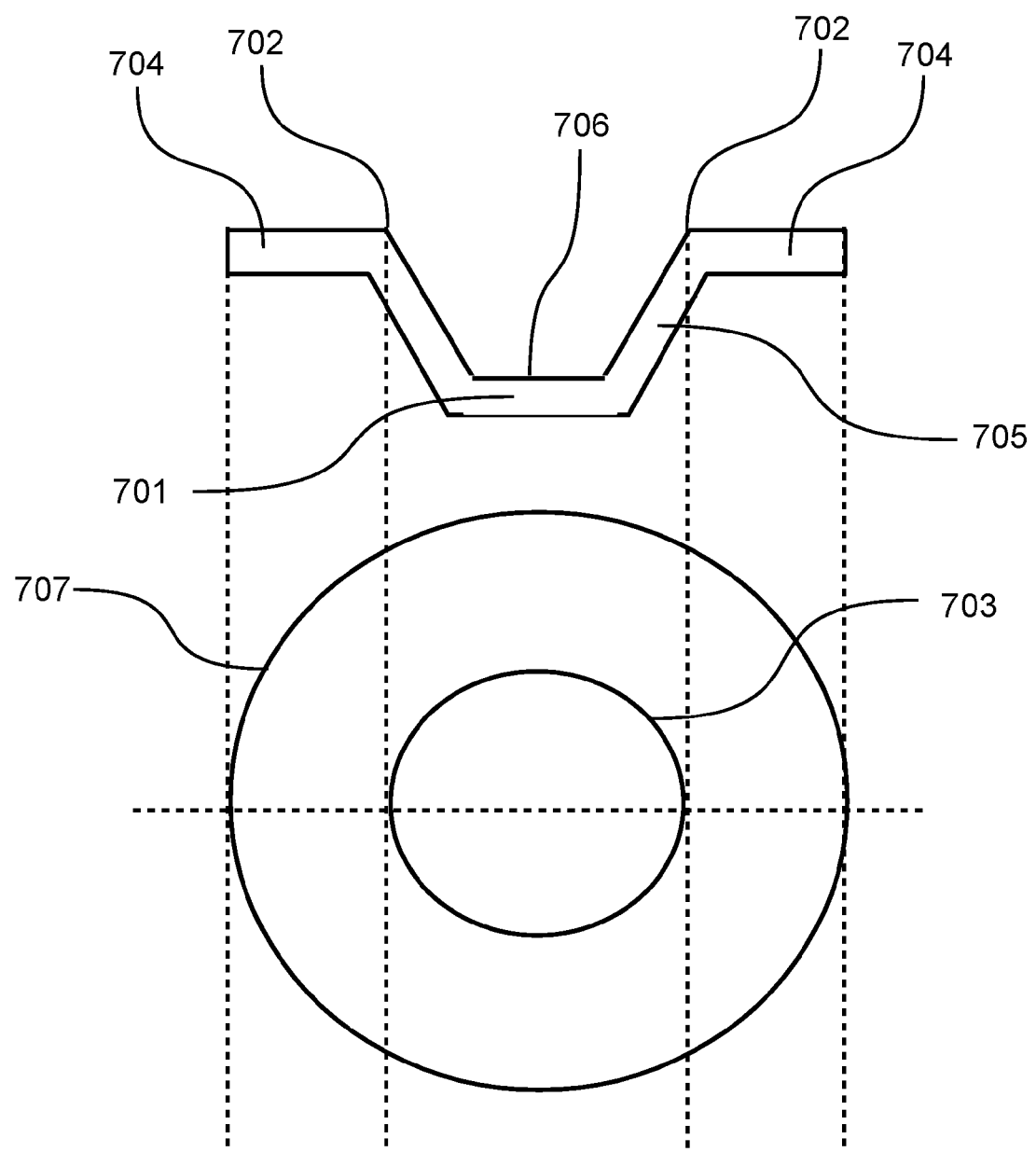
FIG. 7 shows a cross-sectional view and a top view of a via.
Figure 8:
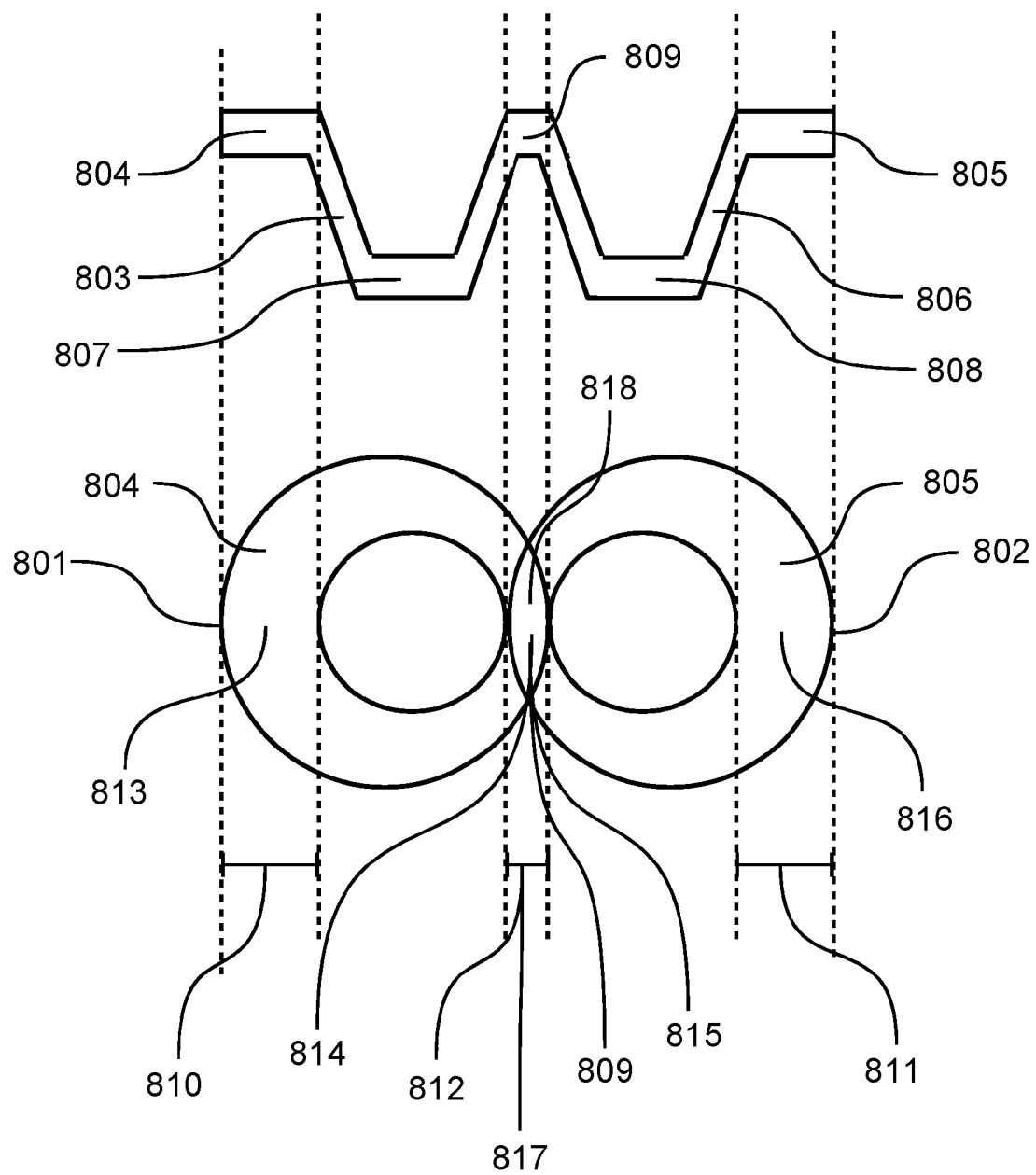
FIG. 8 shows a cross-sectional view and a top view of two vias.
Figure 9:
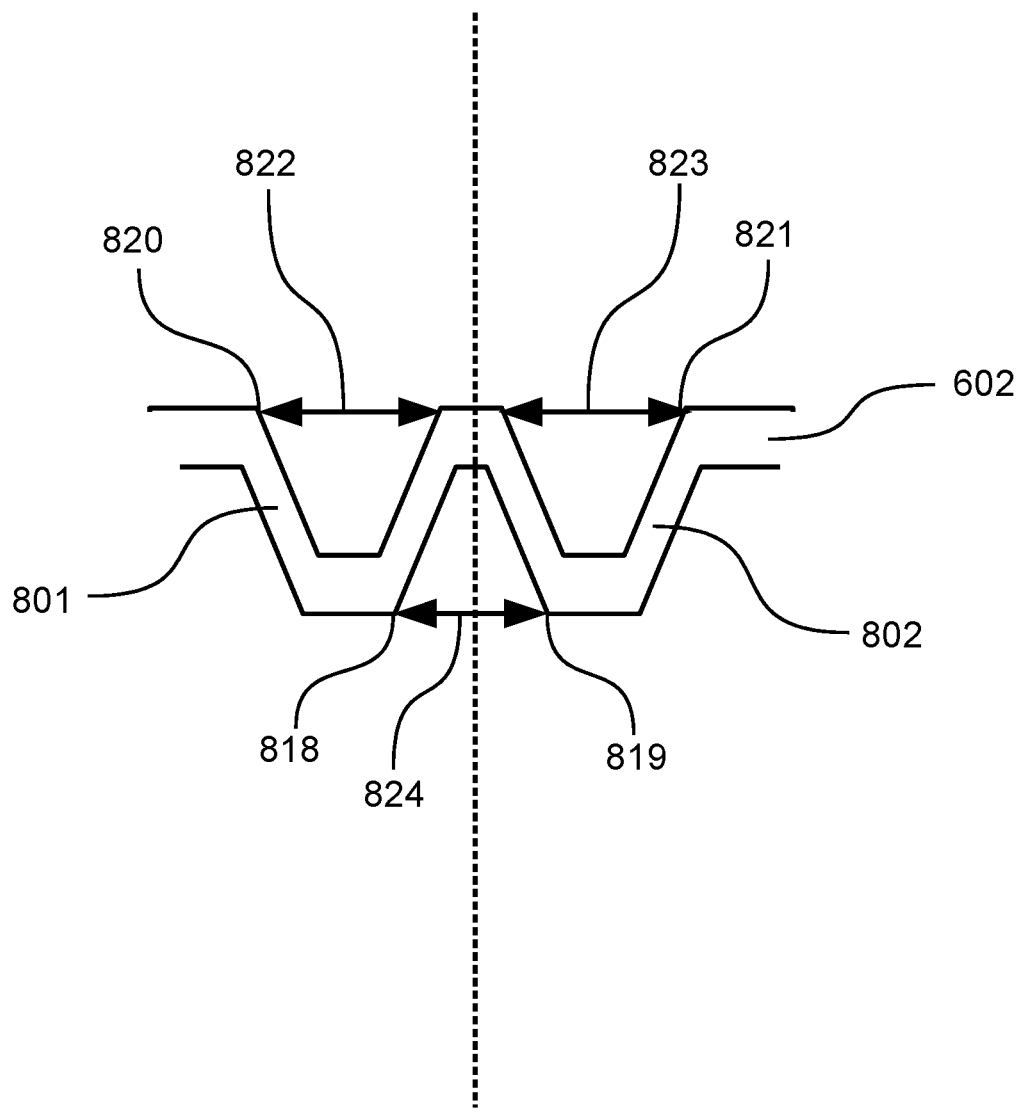
FIG. 9 shows a cross-sectional view of two vias.

FIG. 1 shows an embodiment of a semiconductor device. FIG. 2 shows a cross-sectional view of a redistribution structure. FIG. 3 shows a cross-sectional view of another redistribution structure. FIG. 4 shows an embodiment of a semiconductor device. FIG. 5 shows a cross-sectional view of a connection structure. FIG. 6 shows a cross-sectional view of another connection structure. FIG. 7 shows a cross-sectional view and a top view of a via. FIG. 8 shows a cross-sectional view and a top view of two vias. FIG. 9 shows a cross-sectional view of two vias.

Figure 10:
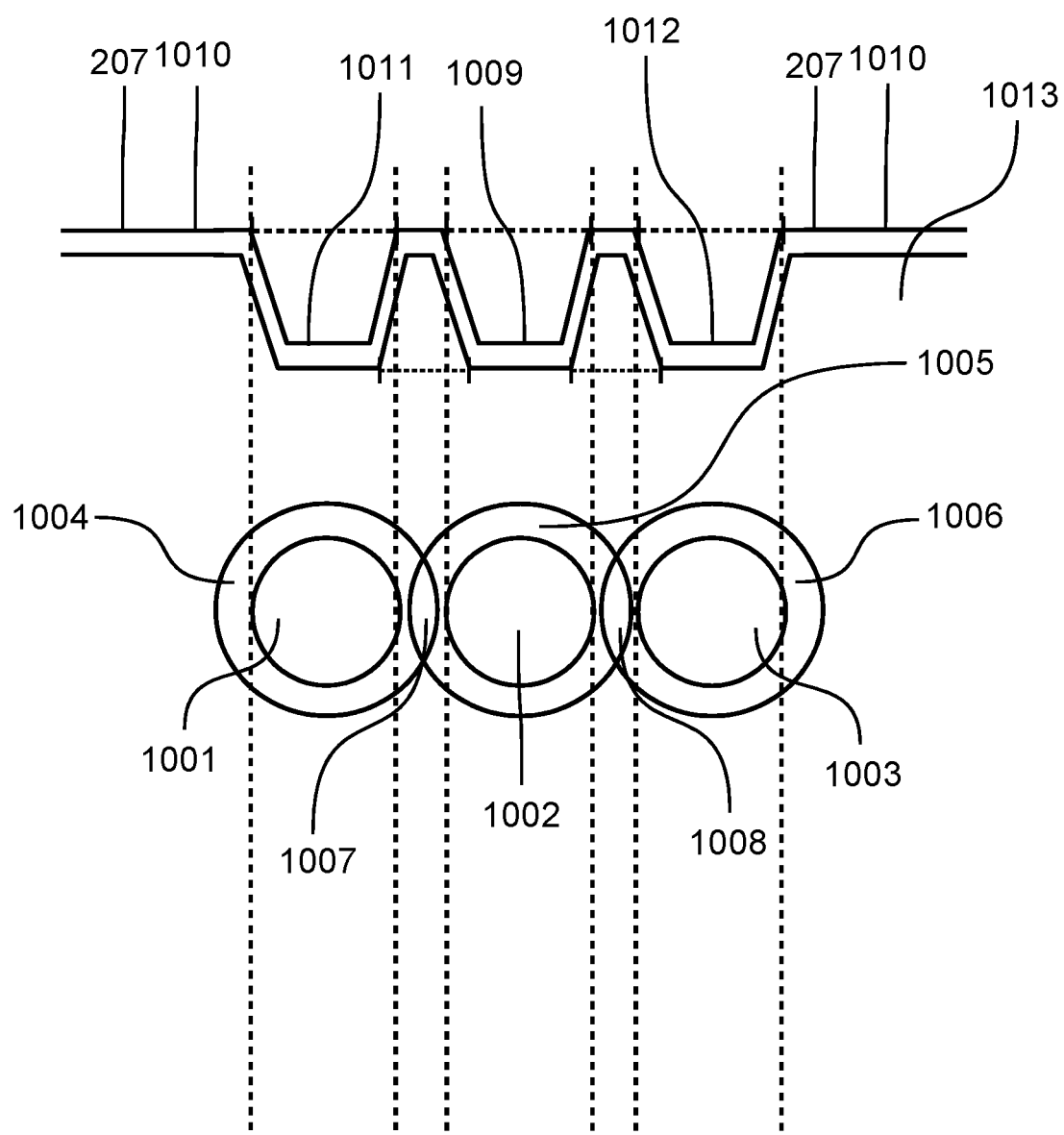
FIG. 10 shows a cross-sectional view and a top view of three vias.
Figure 11:
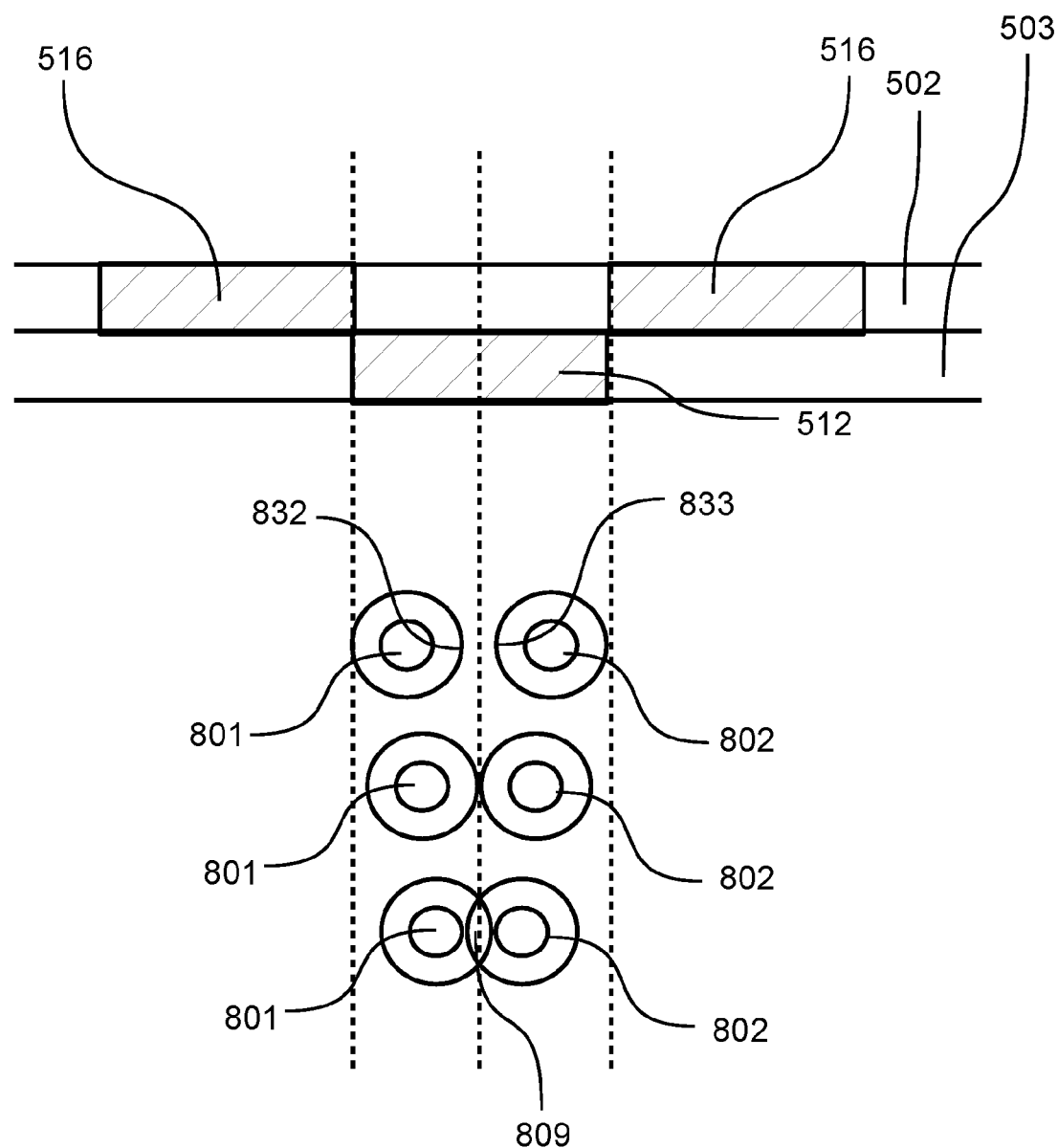
FIG. 11 shows a cross-sectional view of via zones and top views of two vias.
Figure 12:
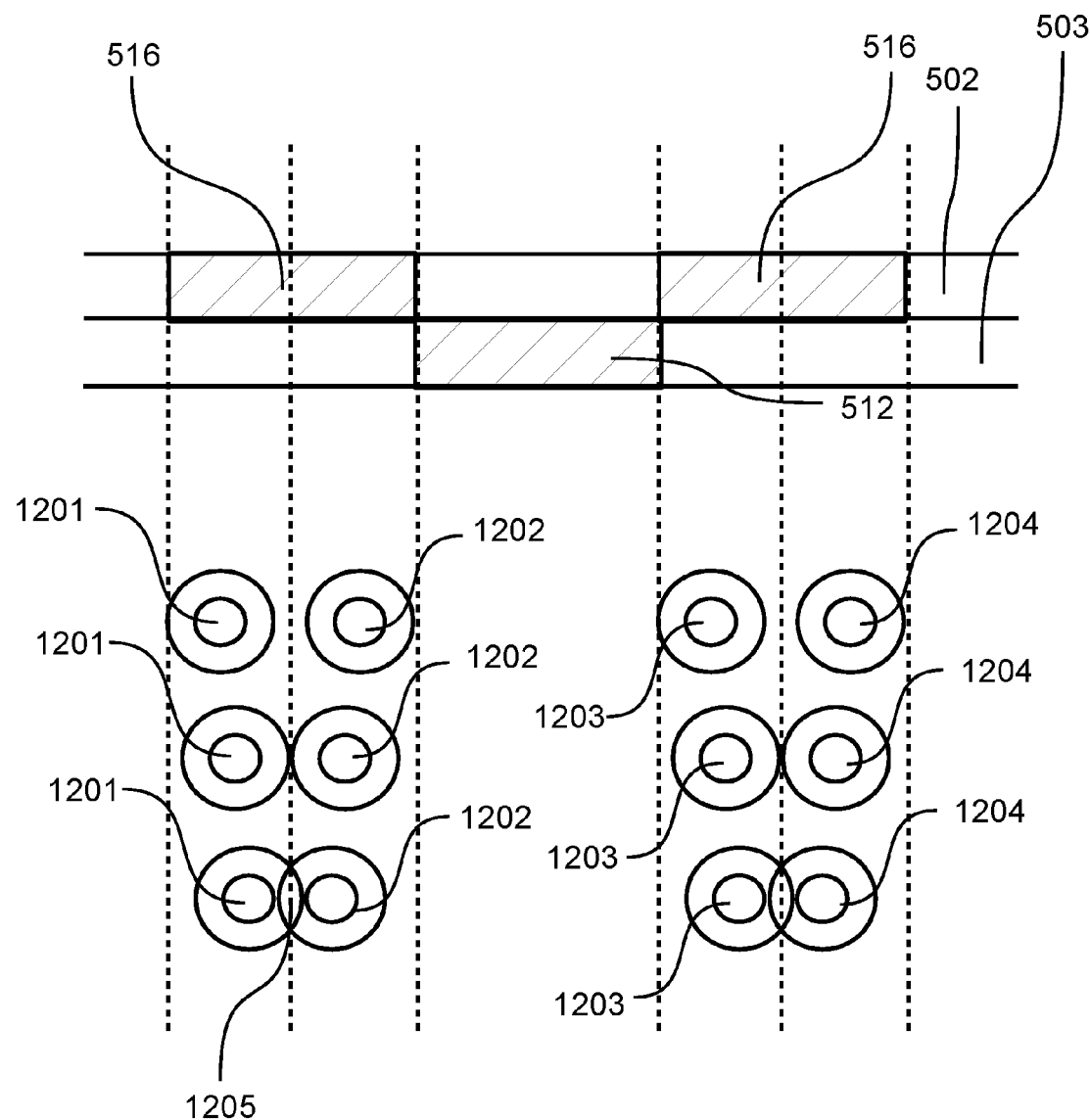
FIG. 12 shows a cross-sectional view of via zones and top views of four vias.
Figure 13:
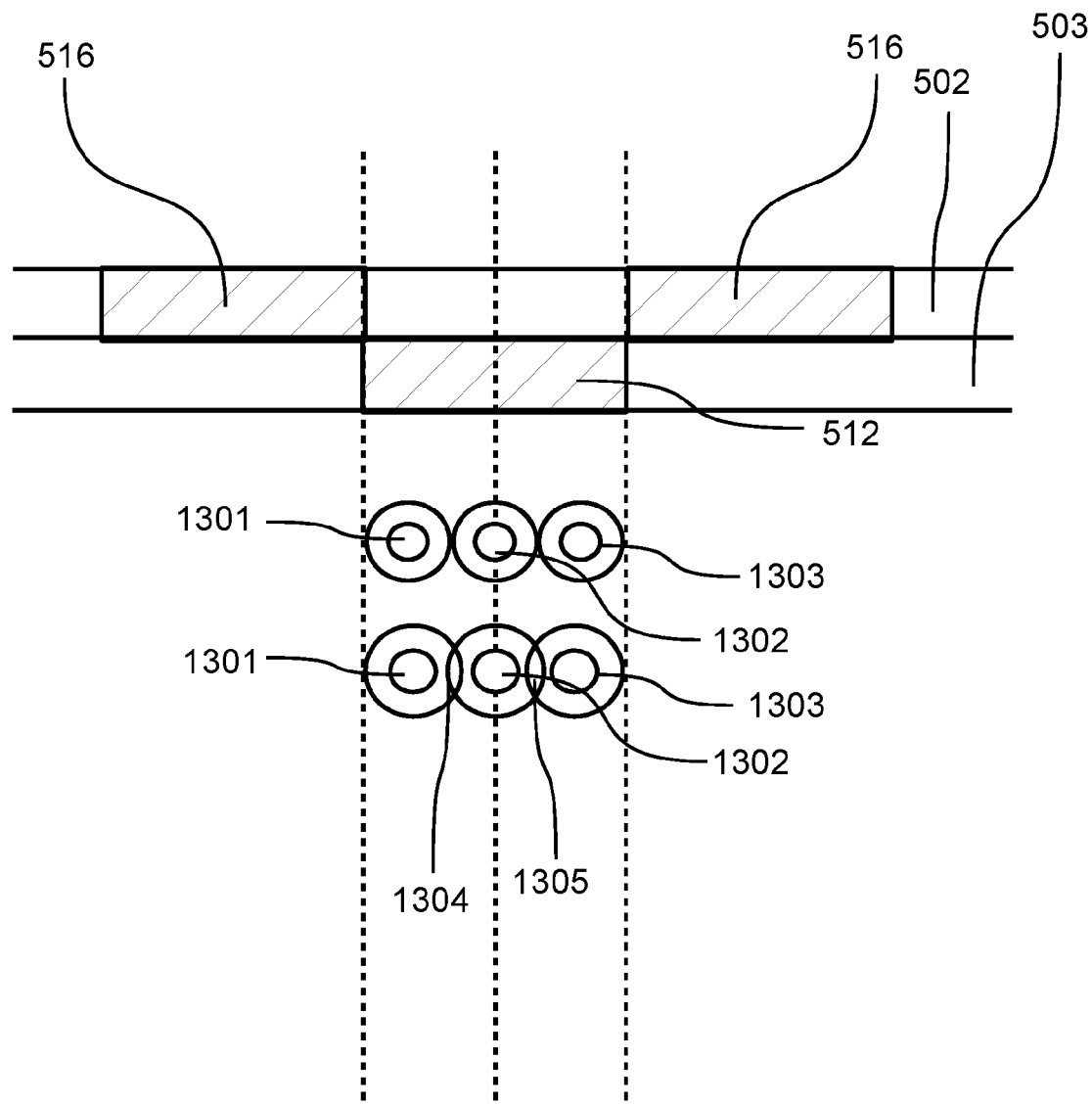
FIG. 13 shows a cross-sectional view of via zones and top views of three vias.
Figure 14:
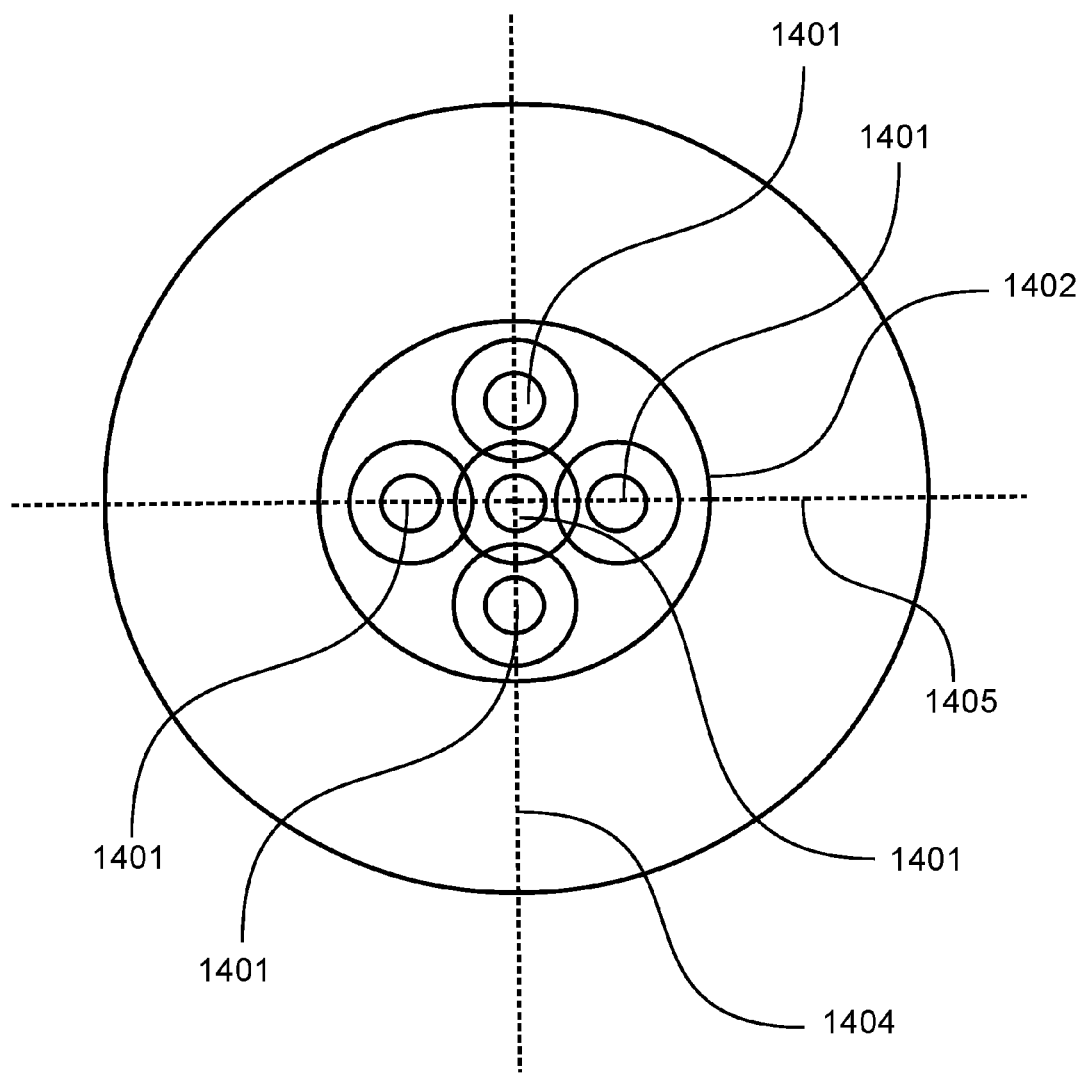
FIG. 14 shows a top view of five vias.
Figure 15:
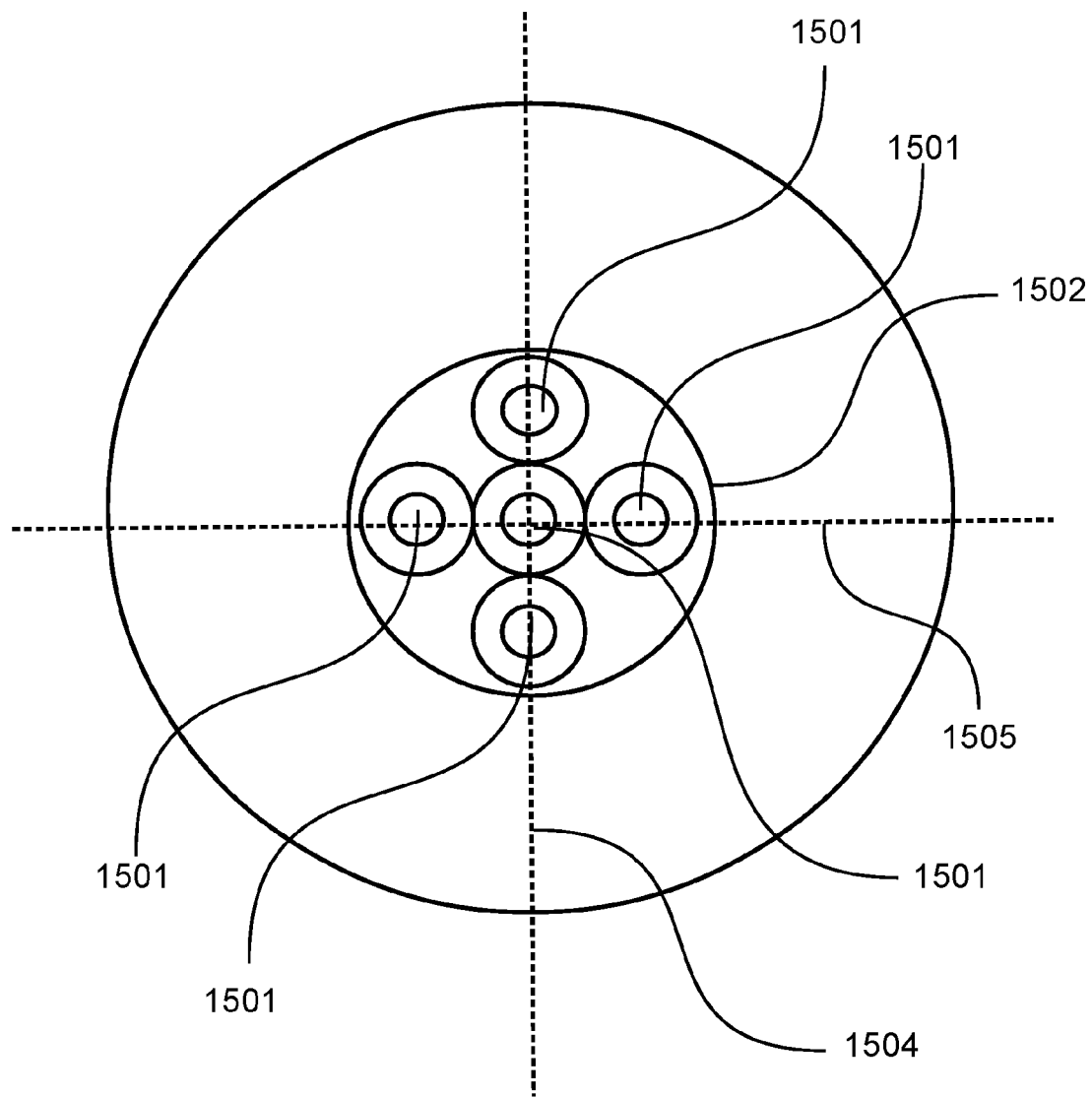
FIG. 15 shows a top view of five vias.
Figure 16:
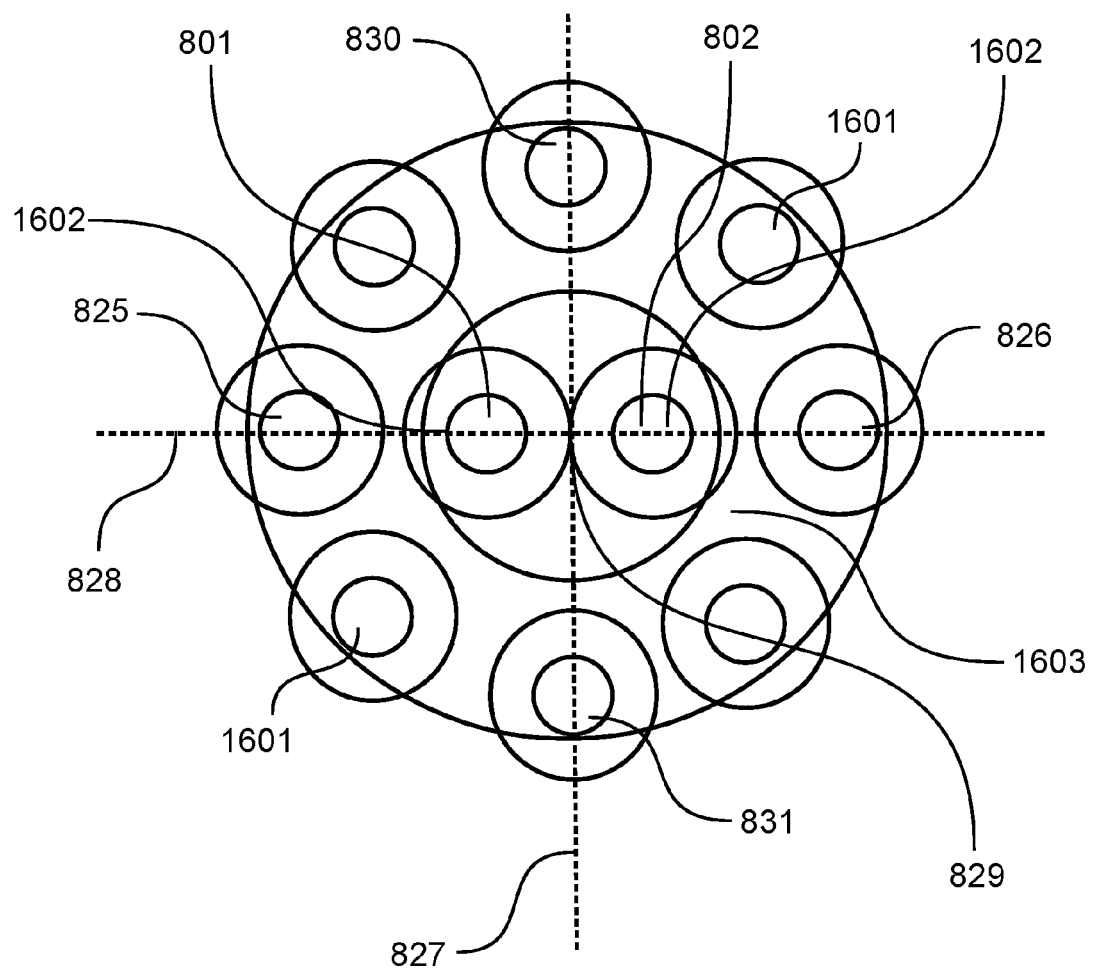
FIG. 16 shows a top view of a plurality of vias.
Figure 17:
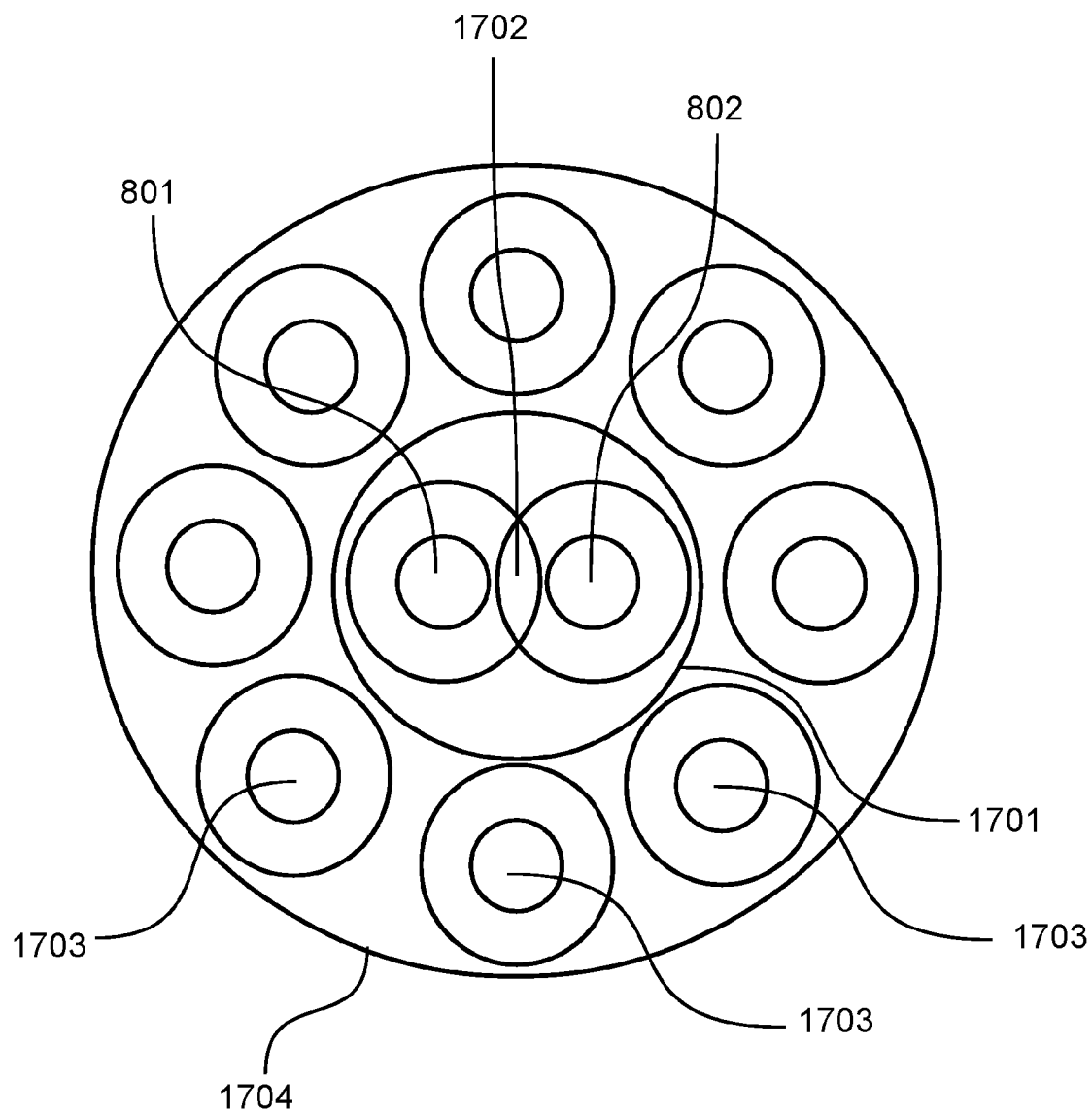
FIG. 17 shows a top view of a plurality of vias.
Figure 18:
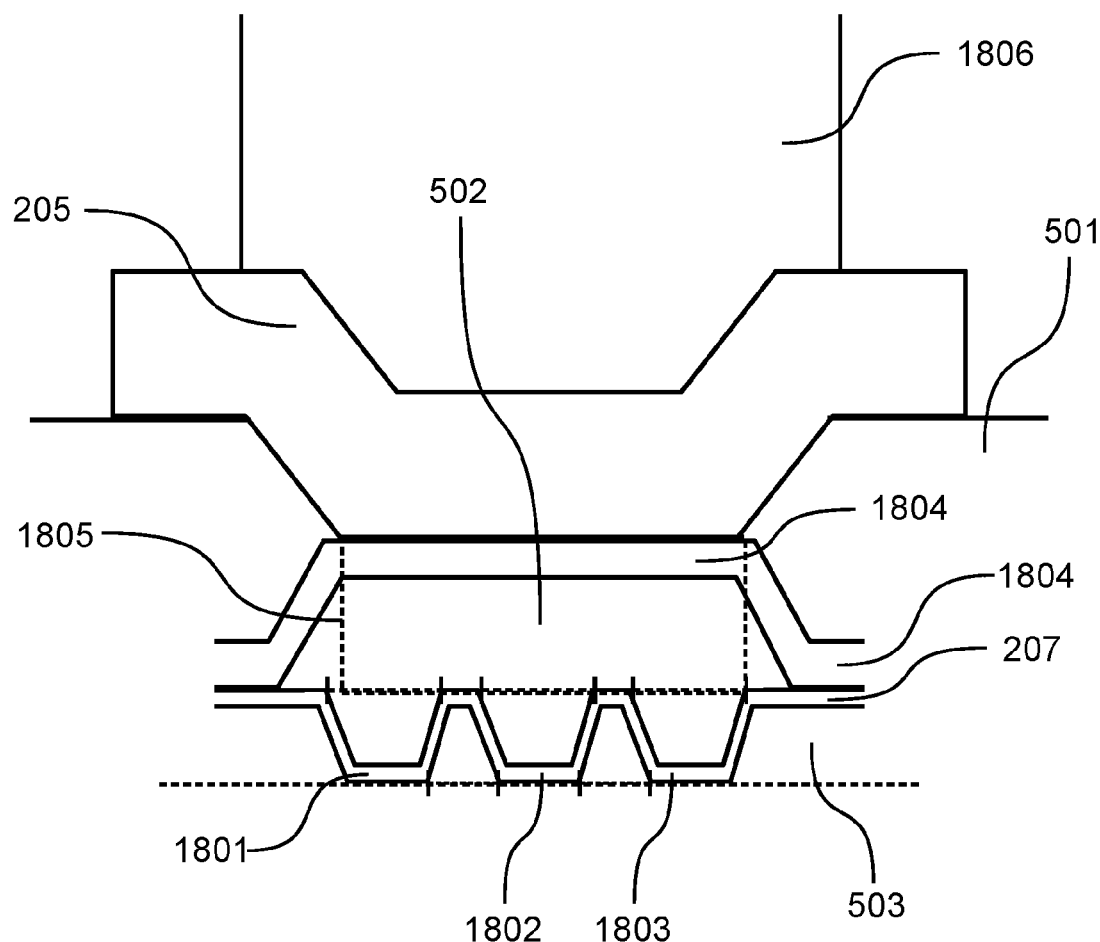
FIG. 18 shows a cross-sectional view of a connection structure.

FIG. 10 shows a cross-sectional view and a top view of three vias. FIG. 11 shows a cross-sectional view of via zones and top views of two vias. FIG. 12 shows a cross-sectional view of via zones and top views of four vias. FIG. 13 shows a cross-sectional view of via zones and top views of three vias. FIG. 14 shows a top view of five vias. FIG. 15 shows a top view of five vias. FIG. 16 shows a top view of a plurality of vias. FIG. 17 shows a top view of a plurality of vias. FIG. 18 shows a cross-sectional view of a connection structure.

According to an embodiment, with reference to FIG. 1 and FIG. 5, a connection structure 500 is disclosed. The connection structure 500 comprises a conductive unit 205, a solder bump 206, a first insulating layer 501, a second insulating layer 502, a third insulating layer 503, and a plurality of vias 1602. The conductive unit 205 has a rim 509. The conductive unit 205 comprises a flange 506, a slanting side wall 507, and a base 508. The solder bump 206 is located on the conductive unit 205. The solder bump 206 is in direct contact with the conductive unit 205. The rim 509 is a curve (viewed from the top of the conductive unit 205) where the flange 506 meets the slanting side wall 507.

The first insulating layer 501 is located under the flange 506. The second insulating layer 502 is located under the base 508 of the conductive unit 205. The third insulating layer 503 is located under the second insulating layer 502. The third insulating layer 503 has a via zone 512. The plurality of vias 1602 are located in the via zone 512. The via zone 512 is within a vertical projection 513 of the conductive unit 205.

The solder bump includes without limitation both lead-based and lead-free solders, such as Pb—Sn compositions for lead-based solder, and lead-free solders including tin, copper, and silver, or "SAC" compositions, and other eutectics that have a common melting point and form conductive solder connections in electrical applications. In some embodiments, the conductive unit 250 includes under bump metal (UBM). In some embodiments, UBM structures include one or more metallic layers, such as layers of titanium and of copper. The UBM can be formed by deposition.

In some embodiments, with reference to FIG. 1, FIG. 5, and FIG. 16, the via zone 512 is a second via zone 512. The second insulating layer 502 has a first via zone 511. The connection structure 500 comprises a plurality of first vias 1601 located in the first via zone 511. The plurality of first vias 1601 are not located beneath the base 508 of the conductive unit 205. In some embodiments, the via zone 512 is within a vertical projection of the rim 509.

In some embodiments, most part of the first via zone 511 is under the base 508 and the slanting side wall 507. That is, most part of the first via zone 511 is under a vertical projection 515 of the base 506 and the slanting side wall 507. A via zone is where vias are allowed to be implemented. In some embodiments, vias are not allowed to be implemented outside a via zone. In some embodiments, the vertical projection 515 is a ring shape from a top view.

With reference to FIG. 5 and FIG. 6, a via zone 516 is twice as large as the first via zone 511 from the cross sectional view. It means that the via zone 516 has more space for implementing vias. A via zone 517 that is the same as the via zone 516 is formed in a fourth insulating layer 504. That is, the via zone 517 allows the same number of vias as the via zone 516 to implement therein. In some embodiments, the number of vias in the via zone 516 is the same as the number of vias. In some embodiments, each of the vias in the via zone 516 has a corresponding via in the via zone 517. In some embodiments, the corresponding vias in the via zone 516 and the via zone 517 are aligned vertically.

The insulating layers 501, 502, 503, and 504 can be polyimide, BCB (Benzocyclobutene), PBO (PolyBenzobisOxazole), or other material having similar insulating properties.

In some embodiments, the redistribution structure 102 further has a via zone 518. The via zone 518 is the same size as the via zone 512 and allows the same number of vias to be implemented. That is, when the via zone 512 can allow 4 vias to implement, the via zone 518 can also allow 4 vias to implement. In some embodiments, each via in the via zone 512 has a corresponding via in the via zone 518. In some embodiments, the corresponding vias in the via zone 512 and the via zone 518 are aligned vertically.

With reference to FIG. 7, a via 701 comprises a flange 704, a slanting side wall 705, and a base 706. The via 701's corresponding top view can be represented by two rings. The inner ring 703 represents a top view of a rim 702. The rim 702 is a curve where a flange 704 meets the slanting side wall 705. The outer ring 707 is a top view of a circular edge of the via 701.

In some embodiments, with reference to FIG. 8, the plurality of vias 1602 comprises a first via 801 and a second via 802. The first via 801 comprises a first via flange 804, a first via slanting wall 803, and a first via base 807. The second via 802 comprises a second via flange 805, a second via slanting wall 806, and a second via base 808. The first via flange 804 and the second via flange 805 have an overlapped area 809. In some embodiments, the first via flange 804 is an annular flange with an uniform width. In some embodiments, the first via flange 804 is an annular flange with a nonuniform width.

In some embodiments, the first via flange 804 has a first width 810 at a first location 813 and a second width 812 at a second location 814. The first location 813 is closer to a central point 815 of the overlapped area 809 than the second location 814. In some embodiments, the second via flange 805 is an annular flange with an uniform width. In some embodiments, the second via flange 805 is an annular flange with a nonuniform width. In some embodiments, the second via flange 805 has a first width 811 at a first location 816 and a second width 817 at a second location 818. The second location 818 is closer to a central point 815 of the overlapped area 809 than the first location 816.

According to another embodiment, with reference to FIG. 1, FIG. 2, FIG. 4, and FIG. 5, a semiconductor device 100 is disclosed. The semiconductor device 100 comprises a die 101, a redistribution structure 102, a printed circuit board 401, and a nonvolatile memory module 402. The die 101 has an active side 103 and a back side 104.

The redistribution structure 102 has a front surface 201 and a back surface 202. The front surface 201 is connected to the active side 103 of the die 101 through a set of metal pillars 204. The redistribution structure 102 comprises a conductive unit 205, a first solder bump 206, a first insulating layer 501, a second insulating layer 502, a third insulating layer 503, and a plurality of vias 1602. The conductive unit 205 has a rim 509. The metal pillars 204 can be aluminum (Al), copper (Cu), tin (Sn), nickel (Ni), gold (Au), or silver (Ag), or other suitable electrically conductive material.

The conductive unit 205 comprises a flange 506, a slanting side wall 507, and a base 508. The back surface 202 is a surface of the first insulating layer 501. The first solder bump 206 is located on the conductive unit 205. The first solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502. The third insulating layer 503 has a via zone 512. The plurality of vias 1602 are located in the via zone 512. The via zone 512 is within a vertical projection 513 of the conductive unit 205.

The redistribution structure 102 is connected to the printed circuit board 401 through the solder bumps 206. The nonvolatile memory module 402 is connected to the printed circuit board 401 through a plurality of second solder bumps 403. A DRAM (Dynamic Random Access Memory) module 405 is connected to the redistribution structure 102 through a plurality of third solder bumps 406 and a plurality of metal posts 107. The metal posts 107 can be formed by plating. The material for the metal post 107 can be Cu, Al, W, Au, solder, or other suitable electrically conductive material.

In some embodiments, the metal posts 107 are connected to the redistribution structure 102 and the solder bumps 406. Electrical signals can be transmitted between the redistribution structure 102 and the DRAM module 405 through the metal posts 107. In some embodiments, the nonvolatile memory module 402 is a Flash memory module.

In some embodiments, an adhesive layer 106 is located on the back side 104 of the die 101. A molding material 105 is filled between the die 101 and the metal posts 107. The molding material 105 is in direct contact with the redistribution structure 102. The adhesive layer 106 can be a die attach film (DAF), or the like. The molding material 105 can be a polymer composite material, such as epoxy resin with filler, epoxy acrylate with filler, or polymer with proper filler.

In some embodiments, with reference to FIG. 2, the redistribution structure 102 further comprises a fourth insulating layer 504 and a fifth insulating layer 505. Metal traces 207 are formed on surfaces of the second insulating layer 502, the third insulating layer 503, the fourth insulating layer 504, and the fifth insulating layer 505 to form proper connections between vias. The metal traces 207 can be aluminum (Al), copper (Cu), tin (Sn), nickel (Ni), gold (Au), or silver (Ag), or other suitable electrically conductive material.

In some embodiments, with reference to FIG. 2 and FIG. 3, the conductive unit 205 is not needed. The solder bump 206 is directly connected to the trace 207.

In some embodiments, the via zone 512 is a second via zone 512. The second insulating layer 502 has a first via zone 511. The semiconductor device 100 further comprises a plurality of first vias 1601 located in the first via zone 511. The plurality of first vias 1601 are not located beneath the base 506 of the conductive unit 205.

According to another embodiment, with reference to FIG. 1, FIG. 5, and FIG. 9, a connection structure 500 comprises a conductive unit 205, a solder bump 206, a first insulating layer 501, a second insulating layer 502, a third insulating layer 503, a first via 801, and a second via 802. The conductive unit 205 has a rim 509. The conductive unit 205 comprises a flange 506, a slanting side wall 507, and a base 508. The solder bump 206 is located on the conductive unit 205. The solder bump 206 is in direct contact with the conductive unit 205.

The first insulating layer 501 is located under the flange 506. The second insulating layer 502 is located under the base 508 of the conductive unit 205. The third insulating layer 503 is located under the second insulating layer 502.

The first via 801 has a first via rim 820. The first via rim 820 has a first via rim diameter 822. The first via 801 has a first via bottom edge 818. The first via 801 is within a vertical projection of the conductive unit 205. The second via 802 has a second via rim 821. The second via rim 821 has a second rim diameter 823. The second via 802 has a second via bottom edge 819. The second via 802 is within the vertical projection of the conductive unit 205. A bottom edge distance 824 is a distance between the first via bottom edge 818 and the second via bottom edge 819. The first rim diameter 822 is greater than the bottom edge distance 824.

With reference to FIG. 5, FIG. 6, and FIG. 10, in some embodiments, three vias 1001, 1002, and 1003 are implemented within the via zone 511. The three vias 1001, 1002, and 1003 are within the vertical projection of the conductive unit 205. In some embodiments, the three vias 1001, 1002, and 1003 are located within the vertical projection of the rim 509. The via 1001 has a flange 1004. The via 1002 has a flange 1005. The via 1003 has a flange 1006. The flange 1004 and the flange 1005 have an overlapped area 1007. The flange 1005 and the flange 1006 have an overlapped area 1008.

With the overlapped areas 1007 and 1008, the three vias 1001, 1002, and 1003 are located more closely. The closely located vias 1001, 1002, 1003 have the function of reducing stress. For the via 1002, the existence of the via 1001 and the via 1003 makes a surface 1010 rugged on both sides of the via 1001, so that the stress applied onto a base 1009 of the via 1002 is reduced. The surface 1010 is a surface formed by the vias 1001, 1003, and traces 207 on an insulating layer 1013. Similarly, the stress applied onto a base 1011 of the via 1001 is reduced. The stress applied onto a base 1012 of the via 1003 is also reduced.

In some embodiments, the connection structure 500 further comprises a plurality of vias 1601 located within the second insulating layer 502. No via of the second insulating layer 502 is located beneath the base 508 of the conductive unit 205. In some embodiments, the first via 801 and the second via 802 are within a vertical projection of the rim 509.

In some embodiments, with reference to FIG. 8, the first via 801 comprises a first via flange 804, a first via slanting wall 803, and a first via base 807. The second via 802 comprises a second via flange 805, a second via slanting wall 806, and a second via base 808. The first via flange 804 and the second via flange 805 have an overlapped area 809.

In some embodiments, the first via flange 804 is an annular flange with an uniform width. In some embodiments, the first via flange 804 is an annular flange with a nonuniform width. In some embodiments, the first via flange 804 has a first width 810 at a first location 813 and a second width 812 at a second location 814. The second location 814 is closer to a central point 815 of the overlapped area 809 than the first location 813.

According to another embodiment, with reference to FIG. 1, FIG. 4, FIG. 5, and FIG. 9, a semiconductor device 100 comprises a die 101, a redistribution structure 102, a printed circuit board 401, a nonvolatile memory module 402, and a DRAM module 405.

The die 101 has an active side 103 and a back side 104. The redistribution structure 102 has a front surface 201 and a back surface 202. The front surface 201 is connected to the active side 103 of the die 101 through a set of metal pillars 204. The redistribution structure 102 comprises a conductive unit 205, a solder bump 206, a first insulating layer 501, a second insulating layer 502, a third insulating layer 503, a first via 801, and a second via 802. The back surface 202 is a surface of the first insulating layer 501.

The conductive unit 205 having a rim 509. The conductive unit 205 comprises a flange 506, a slanting side wall 507, and a base 508. The solder bump 206 is located on the conductive unit 205. The solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502.

With reference to FIG. 5 and FIG. 9, the first via 801 has a first via rim 820. The first via rim 820 has a first via rim diameter 822. The first via 801 has a first via bottom edge 818. The first via 801 is within a vertical projection of the conductive unit 205. The second via 802 has a second via rim 821. The second via rim 821 has a second rim diameter 823. The second via 802 has a second via bottom edge 819. The second via 802 is within the vertical projection of the conductive unit 205. A bottom edge distance 824 is a distance between the first via bottom edge 818 and the second via bottom edge 819. The first rim diameter 822 is greater than the bottom edge distance 824.

The redistribution structure 102 is connected to the printed circuit board 401 through the solder bumps 206. The nonvolatile memory module 402 is connected to the printed circuit board 401 through a plurality of second solder bumps 403. The DRAM module 405 is connected to the redistribution structure 102 through a plurality of third solder bumps 406 and a plurality of metal posts 107. In some embodiments, no via of the second insulating layer 502 is located beneath the base 508 of the conductive unit 205.

According to another embodiment, with reference to FIG. 1, FIG. 5, and FIG. 9, and FIG. 16, a connection structure 500 comprises a conductive unit 205, a solder bump 206, a first insulating layer 501, a second insulating layer 502, a third insulating layer 503, a first via 801, a second via 802, a third via 825, and a fourth via 826.

The conductive unit 205 has a rim 509. The conductive unit 205 comprises a flange 506, a slanting side wall 507, and a base 508. The solder bump 206 is located on the conductive unit 205. The solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502.

The first via 801 is located in the third insulating layer 503. More than half of the first via 801 is within a vertical projection of the rim 509 of the conductive unit 205. The second via 802 is located in the third insulating layer 503. More than half of the second via 802 is within the vertical projection of the rim 509 of the conductive unit 205.

The third via 825 is located in the second insulating layer 502. More than half of the third via 825 is within a vertical projection of the flange 506 and the slanting side wall 507 of the conductive unit 205. The fourth via 826 is located in the second insulating layer 502. More than half of the fourth via 826 is within the vertical projection of the flange 506 and the slanting side wall 507 of the conductive unit 205.

In some embodiments, the first via 801, the second via 802, the third via 825, and the fourth via 826 are symmetric with respect to a first axis 827. In some embodiments, the first via 801, the second via 802, the third via 825, and the fourth via 826 are lined up along a second axis 828. In some embodiments, the connection structure 500 further comprises a fifth via 830 and a sixth via 831. More than half of the fifth via 830 is within the vertical projection of the flange 506 and the slanting side wall 507 of the conductive unit 205. More than half of the sixth via 831 is within the vertical projection of the flange 506 and the slanting side wall 507. The vias 801, 802, 825, 826, 830, and 831 can be aluminum, copper, tungsten, gold, silver, or other suitable electrically conductive material. The method of forming the metal vias can be plating.

With reference to FIG. 5 and FIG. 16, in some embodiments, a plurality of vias are implemented in a via zone 519 of an insulating layer 504. The insulating layer 504 is located beneath the insulating layer 503. In some embodiments, the vias in the via zone 519 are corresponding to the vias in the via zone 511. In some embodiments, the vias in the via zone 511 are vertically aligned with the vias in the via zone 519. In some embodiments, the number of vias in the via zone 511 is the same as the number of vias in the via zone 519.

In some embodiments, the vias in the via zone 519 have the same arrangement as the vias in the via zone 511. In some embodiments, a thickness of bases of vias in the via zone 519 is smaller than a thickness of bases of vias in the via zone 511. In some embodiments, with reference to FIG. 2 and FIG. 5, the conductive unit 205, all vias in the via zone 511, all vias in the via zone 512, all vias in the via zone 519 are electrically connected through metal traces 207 in each insulating layer.

In some embodiments, with reference to FIG. 16, the third via 825, the fourth via 826, the fifth via 830, and the sixth via 831 are symmetric with respect to a central point 829. In some embodiments, with reference to FIG. 8, the first via 801 comprises a first via flange 804, a first via slanting wall 803, and a first via base 807. The second via 802 comprises a second via flange 805, a second via slanting wall 806, and a second via base 808, and the first via flange 804 and the second via flange 805 have an overlapped area 809.

In some embodiments, the via 801 and the via 802 are implemented in the insulating layer 503. The via 825 and the via 826 are implemented in the insulating layer 502. With reference to FIG. 8 and FIG. 16, the via 830 and the via 831 are implemented in the insulating layer 502. The vias belonging to two adjacent layers are not aligned vertically. That is, the vias belonging to two adjacent layers are shifted with respect to each other. In some embodiments, the via 801, the via 802, the via 825, the via 826, the via 830, the via 831, and the conductive unit 205 are all electrically connected through metal traces 207.

In some embodiments, the first via 801 comprises a first via flange 804, a first via slanting wall 803, and a first via base 807. The second via 802 comprises a second via flange 805, a second via slanting wall 806, and a second via base 808. With reference to FIG. 11, a first edge 832 of the first via flange 804 touches a second edge 833 of the second via flange 805.

With reference to FIG. 9 and FIG. 11, the via 801 and the via 802 are within the via zone 512. In some embodiments, the edge 832 does not touch the edge 833. A distance between the edge 832 and the edge 833 is smaller than the diameter of the rim 820 of the via 801. The distance between the edge 832 and the edge 833 is smaller than the diameter of the rim 821 of the via 802. In some embodiments, the edge 832 touches the edge 833 at one point. In some embodiments, the flange of the via 801 is overlapped with the flange of the via 802 and an overlapped area 809 is formed.

Placing the via 801 and the via 802 closely helps to reduce the stress applied on the base of the via 801 and on the base of the via 802. For the via 801, the adjacent via 802 forms a rugged metal surface on one side. It helps to reduce the stress transmitted from that side. For the via 802, the adjacent via 801 forms a rugged metal surface on one side. It helps to reduce the stress transmitted from that side. Placing two or more vias under the conductive unit 205 helps to increase conductivity from the conductive unit 205 to the lower vias and at the same time helps to reduce stress.

With reference to FIG. 12, in some embodiments, two vias 1201 and 1202 are located within the left side via zone 516. Two other vias 1203 and 1204 are located within the right side via zone 516. The via zone 516 forms a ring shape from a top view. The via zone 512 forms a circle shape from a top view. In some embodiments, the via 1201 and the via 1202 are separated from a distance smaller than a diameter of a rim of the via 1201. The distance is also smaller than a diameter of the rim of the via 1202. In some embodiments, the via 1201 touches the via 1202 at one point. In some embodiments, the via 1201 and the via 1202 have an overlapped area 1205.

With reference to FIG. 13, in some embodiments, three vias 1301, 1302, and 1303 are implemented within the via zone 512. In some embodiments, the via 1301 touches the via 1302 at one point. The via 1302 touches the via 1303 at one point. In some embodiments, the via 1301 and the via 1302 have an overlapped flange area 1304. The via 1302 and the via 1303 have an overlapped flange area 1305.

With reference to FIG. 5 and FIG. 14, in some embodiments, five vias 1401 are implemented within a vertical projection 1402 of the rim 509 of the conductive unit 205. In some embodiments, three of the vias 1401 are implemented along an axis 1404. In some embodiments, three of the vias 1401 are implemented along an axis 1405. In some embodiments, all the vias 1401 are about the same size. In some embodiments, each of the vias 1401 has an overlapped flange area with an adjacent via 1401.

With reference to FIG. 5 and FIG. 15, in some embodiments, five vias 1501 are implemented within a vertical projection 1502 of the rim 509 of the conductive unit 205. In some embodiments, three of the vias 1501 are implemented along an axis 1504. In some embodiments, three of the vias 1501 are implemented along an axis 1505. In some embodiments, all the vias 1501 are about the same size. In some embodiments, each of the vias 1501 touches an adjacent via 1501 at one point.

With reference to FIG. 5 and FIG. 16, the via 801 and the via 802 are within a vertical projection 1603 of the rim 509. In some embodiments, a small portion of the via 801 is outside the vertical projection 1603 of the rim 509 and a large portion of the via 801 is within the vertical projection 1603. In some embodiments, a small portion of the via 802 is outside the vertical projection 1603 of the rim 509 and a large portion of the via 802 is within the vertical projection 1603. In some embodiments, the via 801, the via 802, the via 825, and the via 826 are implemented along an axis 828. In some embodiments, the via 830 and the via 831 are implemented along an axis 827.

With reference to FIG. 5 and FIG. 17, in some embodiments, the via 801 and the via 802 are located within a vertical projection 1701 of the rim 509. The via 801 and the via 802 have an overlapped flange area 1702. In some embodiments, a plurality of vias 1703 are implemented within a vertical projection 1704 of the conductive unit 205.

According to another embodiment, with reference to FIG. 1, FIG. 4, FIG. 5, and FIG. 9, and FIG. 16, a semiconductor device 100 comprises a die 101, a redistribution structure 102, a printed circuit board 401, a nonvolatile memory module 402, and a DRAM module 405.

The die 101 has an active side 103 and a back side 104. The redistribution structure 102 has a front surface 201 and a back surface 202. The front surface 201 is connected to the active side 103 of the die 101 through a set of metal pillars 204. The redistribution structure 102 comprises a conductive unit 205, a solder bump 206, a first insulating layer 501, a second insulating layer 502, a third insulating layer 503, a first via 801, a second via 802, a third via 825, and a fourth via 826. The conductive unit 205 has a rim 509. The conductive unit 205 comprises a flange 506, a slanting side wall 507, and a base 508.

The solder bump 206 is located on the conductive unit 205. The solder bump 206 is in direct contact with the conductive unit 205. The first insulating layer 501 is located under the flange 506. The second insulating layer 502 is located under the base 508 of the conductive unit 205. The third insulating layer 503 is located under the second insulating layer 502. The first via 801 is located in the third insulating layer 503.

More than half of the first via 801 is within a vertical projection of the rim 509 of the conductive unit 205. The second via 802 is located in the third insulating layer 503. More than half of the second via 802 is within the vertical projection of the rim 509 of the conductive unit 205. The third via 825 is located in the second insulating layer 502. More than half of the third via 825 is within a vertical projection of the flange 506 and the slanting side wall 507 of the conductive unit 205. The fourth via 826 is located in the second insulating layer 502. More than half of the fourth via 826 is within the vertical projection of the flange 506 and the slanting side wall 507 of the conductive unit 205.

The redistribution structure 102 is connected to the printed circuit board 401 through the solder bump 206. The nonvolatile memory module 402 is connected to the printed circuit board 401 through a plurality of second solder bumps 403. The DRAM module 405 is connected to the redistribution structure 102 through a plurality of third solder bumps 406 and a plurality of metal posts 107. In some embodiments, the first via 801, the second via 802, the third via 825, and the fourth via 826 are symmetric with respect to a first axis 827.

With reference to FIG. 5 and FIG. 18, a via 1801, a via 1802, and a via 1803 are implemented within a vertical projection of the conductive unit 205. A metal layer 1804 is implemented beneath the conductive unit 205. The metal layer 1804 is in direct contact with the base of the conductive unit 205. In some embodiments, the metal layer 1804 has an area that is about the same size of the base of the conductive unit 205.

In some embodiments, the metal layer 1804 has an area that is larger than the size of the base of the conductive unit 205. The area of the metal layer 1804 is just beneath the base of the conductive unit 205 so that it provides good and full contact with the base of the conductive unit 205. In some embodiments, no via is implemented in a zone 1805. The zone 1805 is beneath the base of the conductive unit 205. In some embodiments, the metal layer 1804 is connected to the metal trace 207 so that the metal layer 1804, the metal trace 207, the via 1801, the via 1802, and the via 1803 are all electrically connected. In some embodiments, a metal post 1806 is located on top of the conductive unit 205. In some embodiments, the metal post 1806 is replaced by a solder bump.

One objective of the embodiments is to provide a connection structure that can help to reduce stress in a semiconductor package. Another objective of the embodiments is to provide arrangements of vias below a conductive unit of a redistribution structure so that a better conductivity is achieved. Still another objective of the embodiments is to provide a connection structure that is symmetric with respect to a central point so that a balance of stress is achieved.

What is claimed is:

1. A connection structure, comprising:
    a conductive unit, the conductive unit having a rim, the conductive unit comprising a flange, a slanting side wall, and a base;
    a solder bump, the solder bump being located on the conductive unit, the solder bump being in direct contact with the conductive unit;
    a first insulating layer, the first insulating layer being located under the flange;
    a second insulating layer, the second insulating layer being located under the base of the conductive unit, the second insulating layer having a first via zone;
    a third insulating layer, the third insulating layer being located under the second insulating layer, the third insulating layer having a second via zone; and
    a plurality of vias located in the second via zone, wherein the second via zone is within a vertical projection of the conductive unit, the connection structure comprises a plurality of first vias located in the first via zone, and the plurality of first vias are not located beneath the base of the conductive unit.

2. The connection structure of claim 1, wherein the second via zone is within a vertical projection of the rim.

3. The connection structure of claim 1, wherein the plurality of vias comprise a first via and a second via, the first via comprises a first via flange, a first via slanting wall, and a first via base, the second via comprises a second via flange, a second via slanting wall, and a second via base, the first via flange and the second via flange have an overlapped area.

4. The connection structure of claim 3, wherein the first via flange is an annular flange with a uniform width.

5. The connection structure of claim 3, wherein the first via flange is an annular flange with a nonuniform width.

6. The connection structure of claim 5, wherein the first via flange has a first width at a first location and a second width at a second location, and the second width is closer to a central point of the overlapped area than the first width.

7. A connection structure, comprising:
    a conductive unit, the conductive unit having a rim, the conductive unit comprising a flange, a slanting side wall, and a base;
    a solder bump, the solder bump being located on the conductive unit, the solder bump being in direct contact with the conductive unit;
    a first insulating layer, the first insulating layer being located under the flange;
    a second insulating layer, the second insulating layer being located under the base of the conductive unit;
    a third insulating layer, the third insulating layer being located under the second insulating layer;
    a first via, the first via being in the third insulating layer, the first via having a first via rim, the first via rim having a first via rim diameter, the first via having a first via bottom edge, the first via being within a vertical projection of the conductive unit; and
    a second via, the second via being in the third insulating layer, the second via having a second via rim, the second via rim having a second via rim diameter, the second via having a second via bottom edge, the second via being within the vertical projection of the conductive unit;
    wherein a bottom edge distance is a distance between the first via bottom edge and the second via bottom edge and the first via rim diameter is greater than the bottom edge distance.

8. The connection structure of claim 7, further comprising a plurality of vias located within the second insulating layer, and no via of the second insulating layer is located beneath the base of the conductive unit.

9. The connection structure of claim 7, wherein the first via and the second via are within a vertical projection of the rim.

10. A connection structure, comprising:
    a conductive unit, the conductive unit having a rim, the conductive unit comprising a flange, a slanting side wall, and a base;
    a solder bump, the solder bump being located on the conductive unit, the solder bump being in direct contact with the conductive unit;
    a first insulating layer, the first insulating layer being located under the flange;
    a second insulating layer, the second insulating layer being located under the base of the conductive unit;
    a third insulating layer, the third insulating layer being located under the second insulating layer;
    a first via located in the third insulating layer, more than half of the first via being within a vertical projection of the rim of the conductive unit;
    a second via located in the third insulating layer, more than half of the second via being within the vertical projection of the rim of the conductive unit;
    a third via located in the second insulating layer, more than half of the third via being within a vertical projection of the flange and the slanting side wall of the conductive unit; and a fourth via located in the second insulating layer, more than half of the fourth via being within the vertical projection of the flange and the slanting side wall of the conductive unit.

11. The connection structure of claim 10, wherein the first via, the second via, the third via, and the fourth via are symmetric with respect to a first axis.

12. The connection structure of claim 10, wherein the first via, the second via, the third via, and the fourth via are lined up along a second axis.

13. The connection structure of claim 10, wherein the connection structure further comprises a fifth via and a sixth via, more than half of the fifth via is within the vertical projection of the flange and the slanting side wall of the conductive unit, and more than half of the sixth via is within the vertical projection of the flange and the slanting side wall.

14. The connection structure of claim 13, wherein the third via, the fourth via, the fifth via, and the sixth via are symmetric with respect to a central point.

15. The connection structure of claim 10, wherein the first via comprises a first via flange, a first via slanting wall, and a first via base, the second via comprises a second via flange, a second via slanting wall, and a second via base, and the first via flange and the second via flange have an overlapped area.

16. The connection structure of claim 10, wherein the first via comprises a first via flange, a first via slanting wall, and a first via base, the second via comprises a second via flange, a second via slanting wall, and a second via base, and a first edge of the first via flange touches a second edge of the second via flange.

17. A semiconductor device, comprising:
a die, the die having an active side and a back side;
a redistribution structure, the redistribution structure having a front surface and a back surface, the front surface being connected to the active side of the die through a set of metal pillars, the redistribution structure comprising a conductive unit, a solder bump, a first insulating layer, a second insulating layer, a third insulating layer, a first via, a second via, a third via, and a fourth via, the conductive unit having a rim, the conductive unit comprising a flange, a slanting side wall, and a base, the solder bump being located on the conductive unit, the solder bump being in direct contact with the conductive unit, the first insulating layer being located under the flange, the second insulating layer being located under the base of the conductive unit, the third insulating layer being located under the second insulating layer, the first via being located in the third insulating layer, more than half of the first via being within a vertical projection of the rim of the conductive unit, the second via being located in the third insulating layer, more than half of the second via being within the vertical projection of the rim of the conductive unit, the third via being located in the second insulating layer, more than half of the third via being within a vertical projection of the flange and the slanting side wall of the conductive unit, the fourth via being located in the second insulating layer, more than half of the fourth via being within the vertical projection of the flange and the slanting side wall of the conductive unit;
a printed circuit board, the redistribution structure being connected to the printed circuit board through the solder bump;
a nonvolatile memory module, the nonvolatile memory module being connected to the printed circuit board through a plurality of second solder bumps; and
a DRAM module, the DRAM module being connected to the redistribution structure through a plurality of third solder bumps and a plurality of metal posts.

18. The semiconductor device of claim 17, wherein the first via, the second via, the third via, and the fourth via are symmetric with respect to a first axis.

* * * * *

UNITED STATES PATENT AND TRADEMARK OFFICE
CERTIFICATE OF CORRECTION

| | | |
|---|---|---|
| PATENT NO. | : 9,679,872 B1 | Page 1 of 1 |
| APPLICATION NO. | : 15/253011 | |
| DATED | : June 13, 2017 | |
| INVENTOR(S) | : Chengwei Wu | |

It is certified that error appears in the above-identified patent and that said Letters Patent is hereby corrected as shown below:

In the Claims

Column 11,
Line 51, Claim 1 replace "a plurality of vias" with -- a plurality of second zone vias --

Column 11,
Line 54, Claim 1 replace "plurality of first vias" with -- plurality of first zone vias --

Column 11,
Line 55, Claim 1 replace "the plurality of first vias" with -- the plurality of first zone vias --

Column 11,
Line 60, Claim 3 replace "plurality of vias" with -- plurality of second zone vias --

Column 12,
Line 5, Claim 6 replace "second width" with -- second location --

Column 12,
Line 6, Claim 6 replace "first width" with -- first location --

Signed and Sealed this
Twenty-sixth Day of December, 2017

Joseph Matal
*Performing the Functions and Duties of the*
*Under Secretary of Commerce for Intellectual Property and*
*Director of the United States Patent and Trademark Office*